(12) United States Patent
Ullmann (10) Patent No.: US 9,871,533 B2
(45) Date of Patent: Jan. 16, 2018

(54) HYBRID DIGITAL/ANALOG NOISE SHAPING IN THE SIGMA-DELTA CONVERSION

(71) Applicant: Infineon Technologies AG, Neubiberg (DE)

(72) Inventor: Igor Ullmann, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/421,989

(22) Filed: Feb. 1, 2017

(65) Prior Publication Data

US 2017/0222657 A1 Aug. 3, 2017

(30) Foreign Application Priority Data

Feb. 1, 2016 (DE) .................. 10 2016 101 741

(51) Int. Cl.
*H03M 1/06* (2006.01)
*H03M 3/00* (2006.01)

(52) U.S. Cl.
CPC ........... *H03M 3/352* (2013.01); *H03M 3/358* (2013.01); *H03M 3/458* (2013.01)

(58) Field of Classification Search
CPC .............................. H03M 3/358; H03M 3/458
USPC .................................. 341/118–155
See application file for complete search history.

(56) References Cited

U.S. PATENT DOCUMENTS

| 6,873,281 | B1 | 3/2005 | Esterberg et al. |
| 2008/0158031 | A1 | 7/2008 | Kulinets et al. |
| 2011/0001646 | A1* | 1/2011 | Koch ............... H03M 3/46 341/143 |
| 2013/0249725 | A1* | 9/2013 | Ullmann ........... H03M 1/004 341/143 |
| 2015/0288379 | A1 | 10/2015 | Silva et al. |

FOREIGN PATENT DOCUMENTS

EP 2860875 A1 9/2013

OTHER PUBLICATIONS

Kester, Walt. "Adc Architectures III: Sigma-Delta ADC Basics." Analog Devices, Oct. 2008, 12 pages.
Schreier, Richard Second and Higher-Order Delta-Sigma Modulators, Analog Devices, Mead, Mar. 2008, 24 pages.
Sandy, James. "Decimation For Sigma Delta Modulation." IEEE Transactions On Communications 34.1, vol. 34, Issue: 1, Jan. 1986, 5 pages.
Hauser, Max W. "Principles Of Oversampling A/D Conversion." Journal of the Audio Engineering Society 39.1/2, Feb. 1991, 24 pages.

* cited by examiner

*Primary Examiner* — Lam T Mai
(74) *Attorney, Agent, or Firm* — Slater Matsil, LLP (57) ABSTRACT

An analog/digital converter (ADC) includes an analog stage with at least one first sigma-delta modulator and includes a digital stage with at least one second sigma-delta modulator. The analog stage is configured for outputting a digital signal to the digital stage that is indicative of a noise contribution of the at least one first sigma-delta modulator. The analog stage and the digital stage may be arranged in a multi-stage noise shaping architecture (MASH) architecture.

15 Claims, 7 Drawing Sheets

HYBRID DIGITAL/ANALOG NOISE SHAPING IN THE SIGMA-DELTA CONVERSION

This application claims priority to German patent application 10 2016 101 741.8, filed Feb. 1, 2016, which application is hereby incorporated herein by reference in its entirety.

TECHNICAL FIELD

The present invention relates to various embodiments of the invention relate to an analog/digital converter that includes an analog stage with at least one first sigma-delta modulator and one digital stage with at least one second sigma-delta modulator. Other embodiments relate to a corresponding method. In various examples, the analog stage and the digital stage are arranged in a multi-stage noise shaping architecture.

BACKGROUND

Sigma-delta modulators are used in various technical fields. Analog/digital conversion (A/D conversion) by means of sigma-delta modulators is useful, e.g., in applications such as wireless or wire-connected communication systems, microcontrollers, sensors, audio/video conversion, etc. Such A/D converters (ADCs) provide a wide dynamic range in the conversion of input signals with a low to medium bandwidth. Based on their concept, the A/D conversion by means of sigma-delta modulators (sigma-delta conversion) provides for a high resolution and high linearity.

The principle of sigma/delta conversion is to measure, integrate and compensate for errors in the evaluation. The basic principles of sigma/delta conversion are known, e.g. from NORSWORTHY S. R., SCHREITER R., TEMES G. C. "Delta-Sigma Data Converters: Theory and Simulation", IEEE Press, 2001.

Depending on the application, it may be worthwhile to reduce a noise contribution of the sigma-delta modulation, e.g. due to quantization noise. In this way, an ADC with a higher signal-to-noise ratio (SNR) can be obtained. For this purpose, higher-order sigma-delta modulators are used e.g., according to reference implementations. Higher-order sigma-delta modulators according to reference implementations have a number of analog amplification structures arranged in series or in parallel. Such an amplification structure can be designed, e.g., as integrator.

However, such techniques can have certain disadvantages and restrictions. E.g., higher-order sigma-delta modulators can have instabilities. This may reduce the accuracy and/or the maximum usable dynamic range of the A/D conversion.

SUMMARY

For this reason, there is a need for improved ADCs based on the sigma-delta modulation. In particular, there is a need for ADCs with a higher SNR or dynamic range (DR), respectively.

This object is achieved by the features of the independent patent claims. The features of the dependent patent claims define embodiments.

According to various embodiments, an ADC is provided that includes an analog stage with at least one first sigma-delta modulator. The ADC also includes a digital stage with at least one second sigma-delta modulator. The at least one first sigma-delta modulator is configured to convert an analog input signal into a first digital output signal. The analog stage is configured to output a digital signal to the digital stage, the digital signal being indicative of a noise contribution of the at least one first sigma-delta modulator. The at least one second sigma-delta modulator is configured to convert the digital signal into a second digital output signal. The ADC is configured to determine a digital result signal which is indicative of the analog input signal, based on the first digital output signal and the second digital output signal.

According to various embodiments, an ADC is provided that includes an analog stage with at least one first sigma-delta modulator. The ADC also includes a digital stage with at least one second sigma-delta modulator. The ADC also includes a digital stage with at least one second sigma-delta modulator. The analog stage is configured to output a digital signal to the digital stage. The digital signal is indicative of a noise contribution of the at least one first sigma-delta modulator. The analog stage and the digital stage are arranged in a multi-stage noise shaping architecture.

According to various embodiments, a method is provided that includes coupling an analog stage with at least one first sigma-delta modulator and a digital stage with at least one second sigma-delta modulator by means of a digital signal. The analog stage and the digital stage are arranged in a multi-stage noise shaping architecture.

The features presented above and features which will be described in the text which follows can be used not only in the corresponding combinations presented explicitly, but also in other combinations or isolated, without departing from the scope of protection of the present invention.

DETAILED DESCRIPTION OF ILLUSTRATIVE EMBODIMENTS

The characteristics, features and advantages of the present invention, described above, and the manner in which these are achieved, will become clearer and more distinctly comprehensible in connection with the following description of the exemplary embodiments which will be explained in greater detail in connection with the drawings.

In the text which follows, the present invention will be explained in greater detail by means of preferred embodiments with reference to the drawings. In the figures, identical reference symbols designate identical or similar elements. The figures are schematic representations of various embodiments of the invention. Elements shown in the figures are not necessarily shown true to scale. Instead, the various elements shown in the figures are reproduced in such a manner that their operation and general purpose becomes comprehensible to the expert. Connections and couplings shown in the figures between functional units and elements can also be implemented as indirect connection or coupling. A connection or coupling can be implemented wire-connected or wirelessly. Functional units can be implemented as hardware, software or a combination of hardware and software.

In the text which follows, techniques for A/D conversion are described. In particular, techniques are described in the text which follows which provide for A/D conversion by means of a number of sigma-delta modulators. According to the techniques described in the present text, an ADC includes an analog stage and a digital stage; in this respect, the techniques described in the present text can be designated as hybrid analog/digital techniques.

In various examples, a specific architecture of the analog stage and of the digital stage is described. In this context, the analog stage is arranged in the path of the signal processing before the digital stage. According to various examples, the digital stage can be hierarchically subordinate to the analog stage. The analog stage transfers a digital signal to the digital stage. An exemplary architecture is the multi-stage noise shaping architecture (MASH).

The techniques described in the present text are based on the A/D conversion by means of sigma-delta modulation. The sigma-delta modulation provides for a precise A/D conversion for medium-fast to slow variable signals.

Figure 1A:
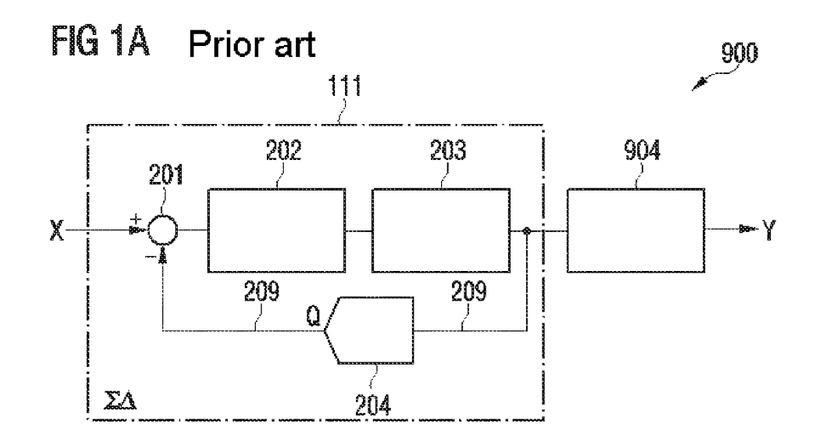
FIG. 1A is a schematic circuit diagram of a conventional ADC with a sigma-delta modulator and FIG. 1B is a schematic illustration of a conventional multi-stage noise shaping architecture that includes three sigma-delta modulators.

FIG. 1A is a block diagram of a conventional ADC 900 which has a first-order sigma-delta modulator 111. According to the prior aft, the ADC 900 can be used for A/D conversion by means of sigma-delta modulation.

In detail, the ADC 900 has two major components, namely the sigma-delta modulator 111 and a digital filter 904. The sigma-delta modulator 111 includes a node 201, an amplification structure 202 which is arranged behind the node, and a comparison circuit 203 which is arranged behind the amplification structure. The output signal of the amplification structure 203 is then transferred to the digital filter 904. The output signal of the amplification structure 203 is also supplied to a feedback path 209. In the feedback path 209, a digital-analog converter (DAC) 204 is arranged. The feedback path leads to the node 201.

In the text which follows, the operation of the sigma-delta modulator 111 is explained. An analog input signal X is supplied to the sigma-delta modulator 111 via the node 201. The input signal X is supplied to the amplification structure 202, for example an integrating circuit, a resonator and/or a passive structure, for example a capacitor, a resistor, an inductance, etc. According to well-known methods, the amplification structure 202 distributes the quantization error or the quantization noise of the ADC 900 so that it is comparatively small in the frequency band of interest. The amplification structure 202 outputs a signal which is input into the comparison circuit 203. E.g., the comparison circuit 203 can be a quantizer or an analog/digital converter. The comparison circuit can output a digital signal which has an n-bit word length; correspondingly, the comparison circuit 203 is also called an n-bit comparison circuit 203.

The output signal of the comparison circuit 203 is conducted to the DAC 204 which, as part of the feedback path 209, outputs an analog proximity signal Q back to the node 201. The analog proximity signal Q is subtracted from the analog input signal X at the node 201 in order to have the effect that the mean value of the signal Q is equal to the input signal X. In this respect, the node 201 can also be called adding element.

The resulting output signal is sent through the comparison circuit 203 and provided as an output signal by the sigma-delta modulator 111 to the digital filter 904 which can be a decimation filter. The digital filter 904 outputs a digital result signal Y with particular characteristics, for example a desired bandwidth and bit width. The digital result signal Y is indicative of the analog input signal X.

The sigma-delta modulator 111 can be configured as a one-bit or multi-bit sigma-delta modulator 111. This can determine the bit depth of the DAC 204 and/or of the comparison circuit 203 and/or of the feedback path 209.

The sigma-delta modulator 111 of FIG. 1A has a single amplification structure 203; sigma-delta modulator 111 according to FIG. 1A is, therefore, also called first-order sigma-delta modulator.

In FIG. 1A, a scenario is illustrated in which the amplification structure 202 is implemented as analog component; the sigma-delta modulator 111 is, therefore, also called an analog sigma-delta modulator 111. In various examples, it is also possible to implement a sigma-delta modulator as digital sigma-delta modulator, i.e. to construct the amplification structure as digital component. In such a case, the signal X can already be present digitally.

In the case of the first-order sigma-delta modulator 111 as shown in FIG. 1A, there is a tendency to the effect that a significant quantization noise occurs when the analog signal is quantized. The quantization noise, which is sometimes called also quantization error noise, limits the dynamic range of the ADC 900. The quantization noise typically significantly influences the noise contribution of the sigma-delta modulator 111 to the output signal. This typically results in a poor SNR of ADC 900. The SNR of ADC 900 can also influence other variables, such as thermal noise or deviations from linear conversion (mismatch errors).

The SNR of the ADC 900 can be described, e.g., by a noise transfer function. The noise transfer function can describe, for example, the SNR of the ADC 900 as a function of the frequency of the input signal X. The suitable formation of the noise transfer function is sometimes called noise shaping. The noise contribution of the sigma-delta modulator 111 to the output signal or to the noise transfer function, respectively, is typically significant.

To improve the signal-to-noise ratio of the ADC 900 in the relevant spectral range, an additional amplification structure or several additional amplification structures can be added in order to generate a higher-order sigma-delta modulator. A sigma-delta modulator with two amplification structures is called, e.g., a second-order modulator, a modulator with three amplification structures is called a third-order modulator, etc.

Increasing the order of the sigma-delta modulator, and thus reducing the quantization noise in the output signal, can provide for a greater bandwidth of the input signal X, a reduced clock frequency and/or an increased output accuracy for example. However, higher-order sigma-delta modulators are susceptible to stability problems which typically lead to unwanted results such as the loss of a connection or of a signal. Since the stability also depends on input signal conditions which are not always known, mathematical treatment and/or simulation does not lead to complete solutions. See, e.g., NORSWORTHY S. R., SCHREIER R., TEMES G. C. "Delta-Sigma Data Converters: Theory and Simulation". IEEE Press, 2001.

In the text which follows, techniques are described which enable an ADC to be implemented on the basis of a number of sigma-delta modulators—for example in accordance with the sigma-delta modulator 111 of FIG. 1. In this context, a previously known analog or digital sigma-delta modulator, for example according to the sigma-delta modulator 111 of FIG. 1A, can serve as component for a greater arrangement (architecture). In examples, a number of sigma-delta modulators according to the MASH architecture are arranged.

In this manner, a comparatively small noise contribution of the sigma-delta modulation to the SNR of the ADC can be achieved. In addition, the sigma-delta modulators of the architecture can be operated in a particularly stable manner. In particular, the techniques described in the present text provide for a high accuracy in the A/D conversion, a low power consumption and/or a hardware-efficient implementation of the ADC.

Figure 1B:
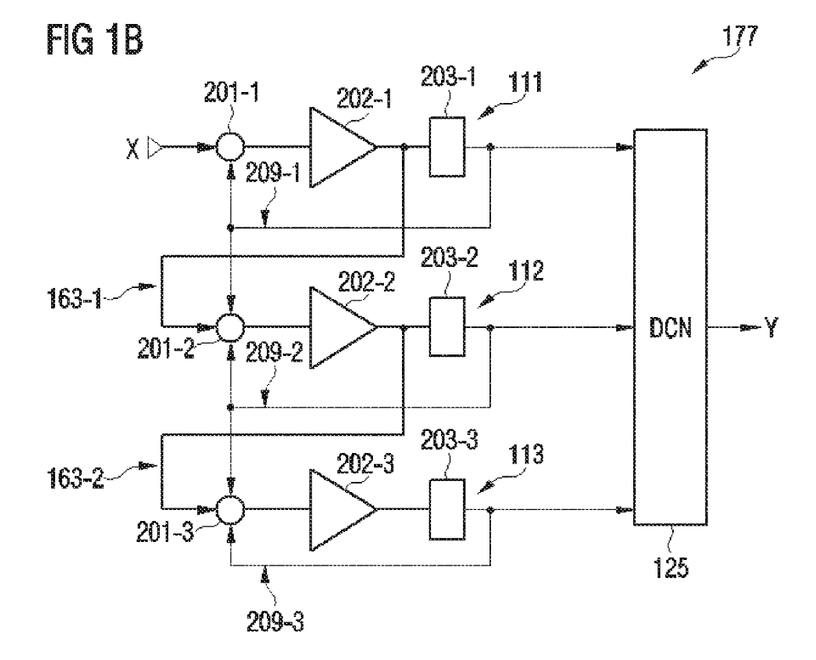

FIG. 1B illustrates aspects with respect to a conventional MASH architecture 177 that includes three analog sigma-delta modulators 111, 112, 113 in a staggered arrangement. In principle, the MASH architecture 177 can also include a greater or lesser number of sigma-delta modulators. The principles of the MASH architecture 177 are known, e.g., from NORSWORTHY S. R., SCHREIER R., TEMES G. C. "Delta-Sigma Data Converters: Theory and Simulation". IEEE Press, 2001.

Each sigma-delta modulator 111, 112, 113 of the MASH architecture 177 includes its own node 201-1, 201-2, 201-3, its own amplification structure 202-1, 202-2, 202-3, its own comparison circuit 203-1, 203-2, 203-3 and its own feedback path 209-1, 209-2, 209-3.

In the MASH architecture 177, a hierarchically higher sigma-delta modulator can transfer, e.g., an error signal 164-1, 164-2 to the hierarchically lower sigma-delta modulator, the error signal being indicative of the noise contribution of the hierarchically higher sigma-delta modulator. The noise contribution can includes, in particular, quantization noise. The error signal 163-1, 163-2 is obtained by comparing the signal before and after the respective comparison circuit 203-1, 203-2, 203-3. In FIG. 1B, the comparing takes place directly in the respective node 201-2, 201-3 of the hierarchically lower-order sigma-delta modulator 112, 113; in other examples, a further node can be implemented in order to generate the error signal.

In the MASH architecture 177, the result signal can be determined on the basis of the output signals of the sigma-delta modulators. In this context, a digital correction circuit 125 can be used, e.g. in a differentiating circuit in a single implementation. Whilst in FIG. 1B, an example is shown in which the correction circuit 125 influences the output signals of all sigma-delta modulators 111, 112, 113, the correction circuit 125 can influence the output signals of only the single sigma-delta modulators of the MASH architecture 177 in other examples.

By using the MASH architecture, a low noise contribution of the sigma-delta modulation can be achieved. In particular, it may be possible to compensate at least partially for the noise contribution of the hierarchically higher sigma-delta modulator 111.

Techniques which have been described above with reference to FIG. 1b for the MASH architecture 177 can be applied in the various examples described here.

Figure 2:
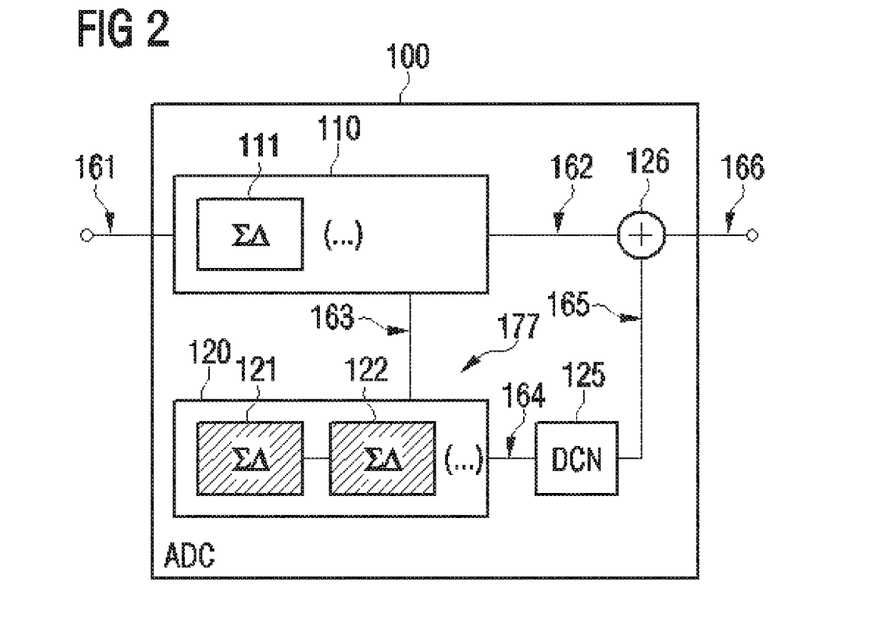
FIG. 2 is a schematic illustration of an ADC with an analog stage and a digital stage according to various embodiments, the analog stage including a sigma-delta modulator and the digital stage including two sigma-delta modulators.

FIG. 2 illustrates aspects of an exemplary ADC 100 that includes an analog stage with an analog sigma-delta modulator 111 and a digital stage 120 with two digital sigma-delta modulators 121, 122, the analog stage 110 and the digital stage 120 being arranged in a MASH architecture 177.

The MASH architecture 177 according to the example of FIG. 2 includes the three sigma-delta modulators 111, 121, 122. The error signal 163 is transferred from the analog stage 110 to the digital stage 120 and is indicative for the noise contribution of the sigma-delta modulator 111 of the analog stage no. The error signal 163 is a digital signal and has a particular word length. The analog stage no outputs an output signal 162 which is added to an output signal 165 in a node 126. In this manner, the digital result signal 166 is obtained which is indicative of the analog input signal 161. The result signal 165 is obtained by adapting the result signal 164 by a digital correction circuit 125. The digital correction circuit 125 is configured to perform an adaptation of the output signal 164 which is different to the output signal 162, so that the signals 162, 165 can be combined in the node 126. In other examples, the digital correction circuit 125 could also perform an adaptation of the output signal 162 to the output signal 164 (not shown in FIG. 2).

By means of the digital stage 120 or combining the output signal 162 with the output signal 165, respectively, the noise contribution of the sigma-delta modulator 111 of the analog stage no can be compensated for at least partially. Thus, the signal noise in the result signal 166 can be reduced and an improved SNR obtained. In particular, noise shaping can be performed. For example, the noise transfer function of the ADC 100 can be optimized by suitably adapting the digital stage 120.

By using the digital stage 120, the noise shaping can be implemented particularly cost-effectively and/or reliably. In particular, the number of analog components needed in comparison with conventional ADCs with a comparable noise transfer function can be reduced; this typically allows costs to be reduced. In addition, the installation space needed can often be reduced to one semiconductor chip. Furthermore, there is an effect, often worthwhile, the possible partial use of a digital sigma-delta modulator for continued noise shaping of an upstream analog sigma-delta modulator in the practical freedom of errors and tolerance of digital circuits compared with their analog pendants. Temperature and aging effects, which can be a possible accompanying phenomenon in the case of circuits of analog construction, virtually do not occur in digital circuits.

Figure 3:
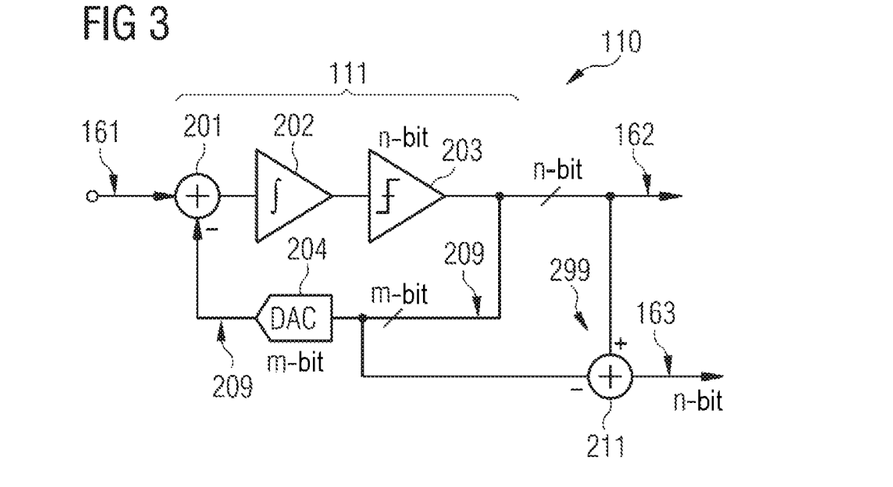
FIG. 3 is a schematic circuit diagram of a first-order sigma-delta modulator according to various embodiments.

FIG. 3 illustrates aspects with respect to the analog stage 110. In particular, FIG. 3 illustrates aspects with respect to the implementation of an output circuit 299 for the digital error signal 163.

In the example of FIG. 3, the analog stage no includes a first-order sigma-delta modulator 111. In general, it would also be possible that the analog stage no includes a higher-order sigma-delta modulator 111, for example of L-th order, L being at least equal to two.

In the example of FIG. 3, the sigma-delta modulator 111 includes an n-bit comparison circuit 203; the DAC 204 operates on an m-bit word length so that it is possible to talk about an m-bit feedback path 209. The following applies: m≤n. E.g., n≥2 and m=1 can apply. Preferably, n can be >3. The output signal 162 has an n-bit word length.

The digital error signal 163 can also have an n-bit word length. It is possible, e.g., that the at least one sigma-delta modulator of the digital stage 120 operates with an n-bit word length, i.e. includes an n-bit feedback path (not shown in FIG. 3).

By forming a difference at the node 211 of the output circuit 299 between the m-bit feedback signal of the feedback path 209 and the n-bit output signal 162, the digital error signal 163 is indicative of the noise contribution of the sigma-delta modulator 111.

By using a greater word length for the at least one sigma-delta modulator of the digital stage 120 or the digital error signal 163, respectively, a particularly good compensation of the noise contribution of the at least one sigma-delta modulator 111 of the analog stage no can take place. In particular, an accuracy of the operation of the at least one sigma-delta modulator of the digital stage 120 can be comparatively great. For this reason, it may be worthwhile in principle to choose n to be particularly large, thus, e.g., n>3 bits.

On the other hand, by using a short word length for the DAC 204 of the at least one sigma-delta modulator 111 of the analog stage 110, a cost-effective and simple implementation of the sigma-delta modulator 111 of the analog stage 110 can be achieved. In addition, a particularly high linearity can be achieved in the operation of the at least one sigma-delta modulator 111 of the analog stage 110 if 1 bit is used for the feedback path or the feedback paths, as a rule the most significant bit (MSB) which can be implemented in each case by a 1-bit DAC 204.

FIG. 3 illustrates an exemplary implementation of the sigma-delta modulator 111 and of the output circuit 299 for outputting the digital error signal 163. In different examples, other implementations of the sigma-delta modulator 111 and/or of the output circuit 299 can also be implemented.

Figure 4:
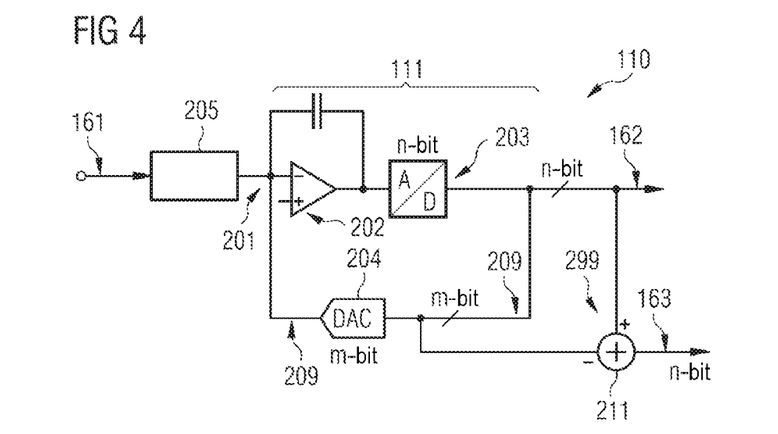
FIG. 4 is a schematic circuit diagram of a first-order sigma-delta modulator according to various embodiments.

FIG. 4 illustrates a further exemplary implementation of the sigma-delta modulator 111. In the example of FIG. 4, the sigma-delta modulator 111 also includes an input stage 205, for example a continuous-time (CT) input stage or a switched-capacitor (SC) input stage. The amplification structure 202 is constructed as operational amplifier with parallel-connected capacitor(s). The comparison circuit 203 is constructed as ADC. In the example of FIG. 4, the output circuit 299 corresponds to the output circuit 299 according to the example of FIG. 3.

Figure 5:
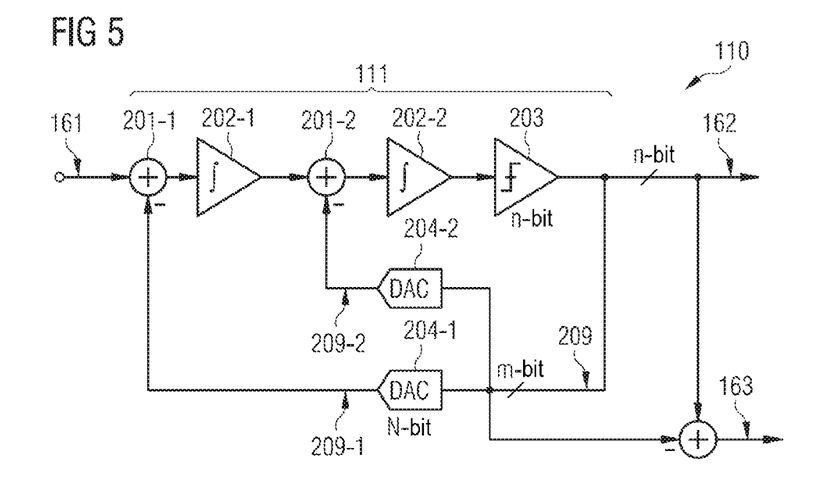
FIG. 5 is a schematic circuit diagram of a second-order sigma-delta modulator according to various embodiments.

FIG. 5 illustrates aspects with respect to a higher-order analog sigma-delta modulator 111. In particular, a second-order sigma-delta modulator 111 is shown in FIG. 5. The sigma-delta modulator 111 in the example of FIG. 5 includes two DACs 204-1, 204-2, two feedback paths 209-1 and 209-2, two nodes 201-1, 201-2 and two amplification structures 202-1, 202-2. The sigma-delta modulator 111 in the example of FIG. 5 also includes an individual comparison circuit 203. In some examples, the higher-order sigma-delta modulator 111 can also use a single DAC for the various feedback paths 209-1, 209-2 (not shown in FIG. 5).

Figure 6:
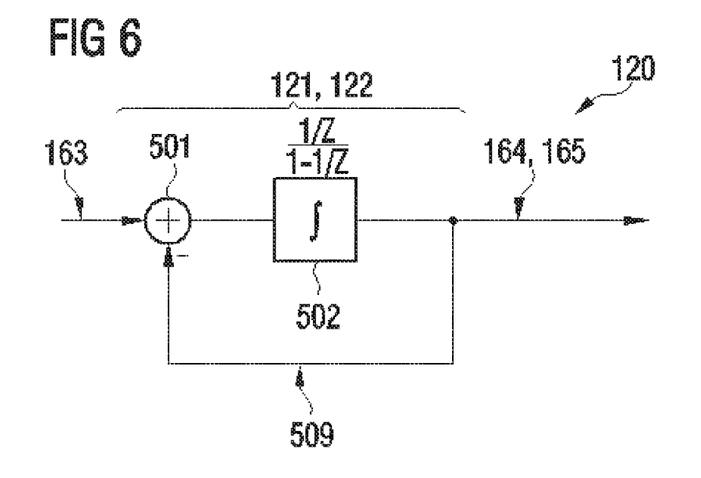
FIG. 6 is a schematic circuit diagram of a first-order sigma-delta modulator according to various embodiments.

FIG. 6 illustrates aspects with respect to a digital sigma-delta modulator 121, 122. The sigma-delta modulator 121, 122 shown in the example of FIG. 6 can be used as part of the digital stage 120 in the various examples described in the present text. The input signal, for example the digital error signal 163 in the MASH architecture 177 is supplied with a node 501. A digital amplification structure 502 has a particular noise transfer function as shown in FIG. 6. The sigma-delta modulator 121, 122 also has a feedback path 509.

Whilst the sigma-delta modulator 121, 122 in the example of FIG. 6 is of the first order, a higher-order digital sigma-delta modulator can also be implemented in various other examples; for this purpose, a number of nodes 501 and a number of amplification structures 502 can be provided (not shown in FIG. 6).

It is also possible that the sigma-delta modulator 121, 122 includes an output circuit 299 which outputs a digital error signal to an hierarchically lower-rank sigma-delta modulator. A MASH architecture of the digital stage 120 can be implemented in this manner.

Figure 7:
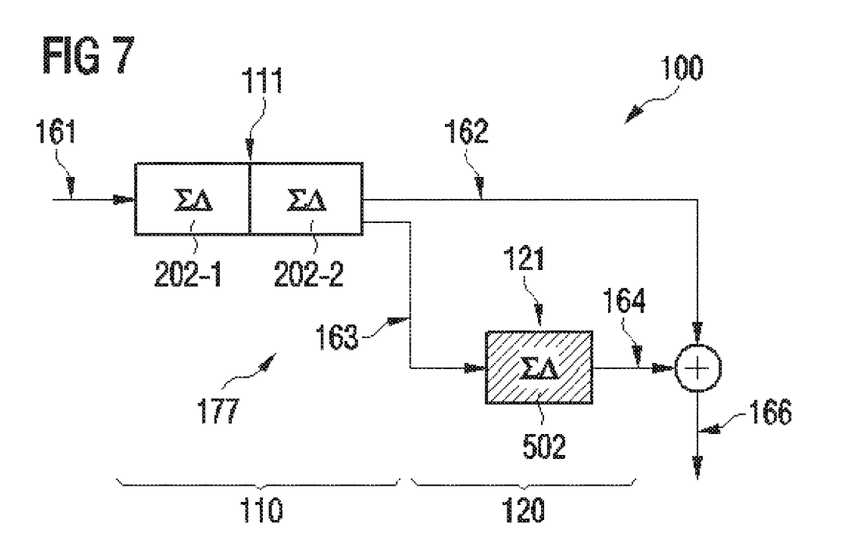
FIG. 7 illustrates an ADC according to various embodiments schematically, the ADC including an analog stage with a second-order sigma-delta modulator and a digital stage with a first-order sigma-delta modulator.

FIG. 7 illustrates aspects with respect to a MASH architecture 177 which is formed by the analog stage no and the digital stage 120. In the example of FIG. 7, a 2-1 MASH architecture 177 is shown; that is to say, a second-order analog sigma-delta modulator 111 and a first-order digital sigma-delta modulator 121 are used. From FIG. 7, it can be seen that the sigma-delta modulator 111 includes two amplification structures 202-1, 202-2; the sigma-delta modulator 121, however, only has a single amplification structure 502.

Figure 8:
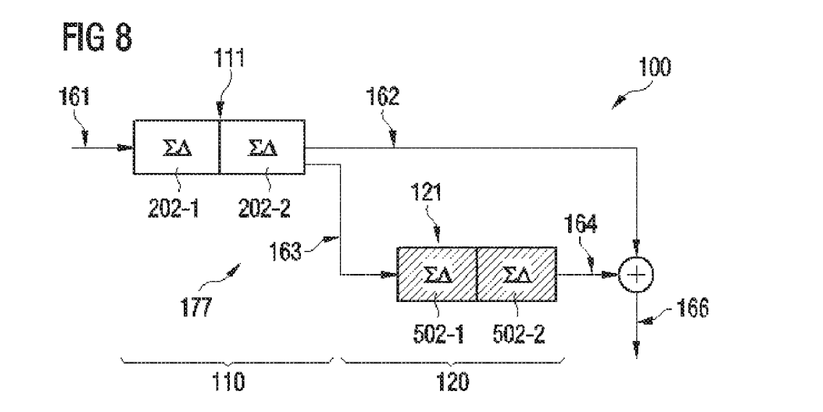
FIG. 8 illustrates an ADC according to various embodiments schematically, which includes an analog stage with a second-order sigma-delta modulator and a digital stage with a second-order sigma-delta modulator.

FIG. 8 illustrates aspects with respect to a MASH architecture 177 which is formed by the analog stage no and the digital stage 120. In the example of FIG. 8, a 2-2 MASH architecture 177 is shown; i.e., a second-order analog sigma-delta modulator 111 is used and a second-order digital sigma-delta modulator 121. From FIG. 8, it can be seen that the sigma-delta modulator 111 includes two amplification structures 202-1, 202-2; the sigma-delta modulator 121 also has two amplification structures 502-1, 502-2.

Figure 9:
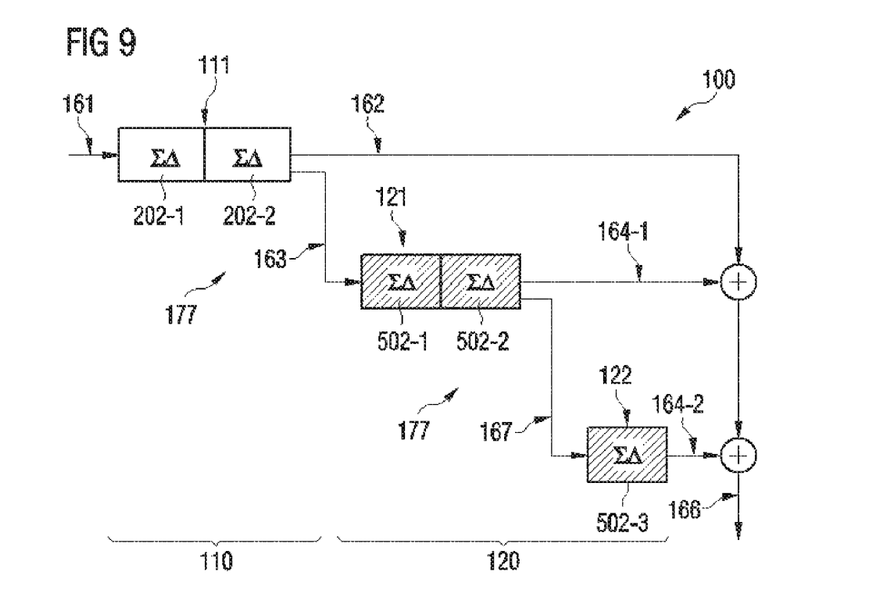
FIG. 9 illustrates an ADC according to various embodiments schematically, the ADC including an analog stage with a second-order sigma-delta modulator and a digital stage with a second-order sigma-delta modulator and a further first-order sigma-delta modulator, the sigma-delta modulators of the digital stage being arranged in a multi-stage noise shaping architecture.

FIG. 9 illustrates aspects with respect to a MASH architecture 177 which is formed by the analog stage no and the digital stage 120. In the example of FIG. 9, a 2-2-1 MASH architecture 177 is shown; that is to say, a second-order analog sigma-delta modulator 111 is used, a second-order digital sigma-delta modulator 121, and a first-order digital sigma-delta modulator 122. The digital sigma-delta modulators 121, 122 are arranged in a MASH architecture 177 with respect to one another, i.e. the digital stage 120 also has a MASH architecture 177. This means that the sigma-delta modulator 121 outputs a digital error signal 167 to the sigma-delta modulator 122 which is indicative of a noise contribution of the sigma-delta modulator 121. Both the sigma-delta modulator 121 and the sigma-delta modulator 122 in each case include their own feedback path 509 (not shown in FIG. 9). From FIG. 9, it can be seen that the sigma-delta modulator 111 includes two amplification structures 202-1, 202-2; the sigma-delta modulator 121 also has two amplification structures 502-1, 502-2; the sigma-delta modulator 122 has a single amplification structure 502-3.

Figure 10:
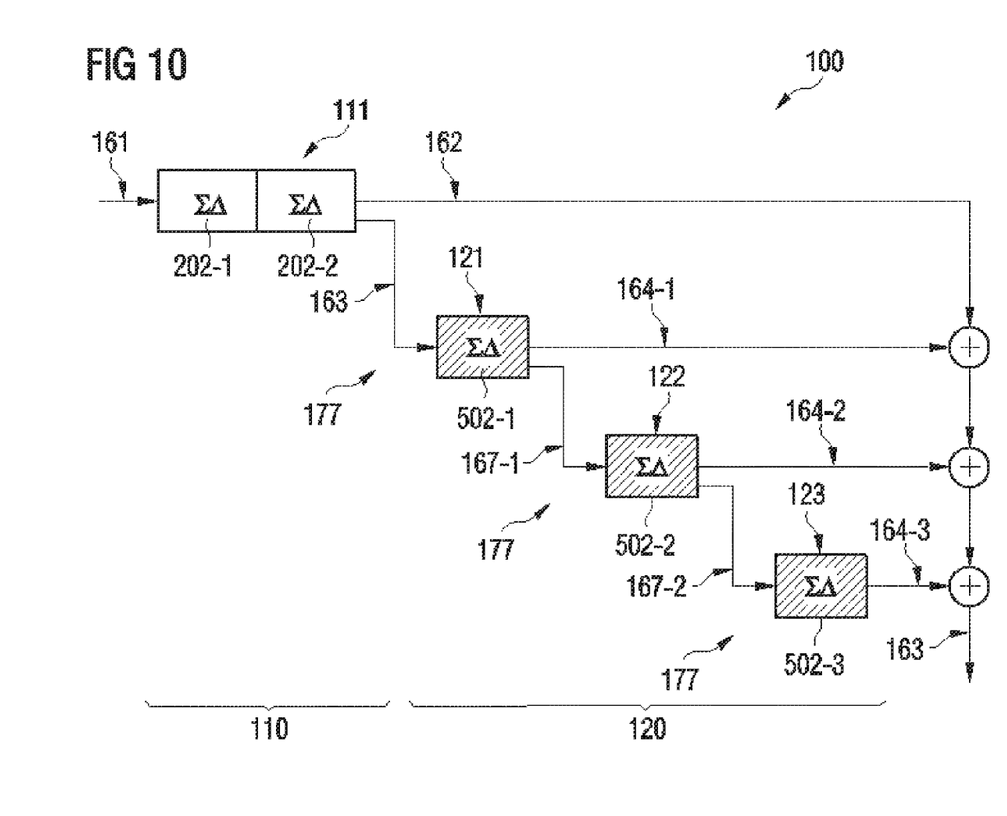
FIG. 10 illustrates an ADC according to various embodiments schematically, the ADC including an analog stage with a second-order sigma-delta modulator and a digital stage with three first-order sigma-delta modulators, the three sigma-delta modulators of the digital stage being arranged in a multi-stage noise shaping architecture.

FIG. 10 illustrates aspects with respect to a MASH architecture 177 which is formed by the analog stage 110 and the digital stage 120. In the example of FIG. 10, a 2-1-1-1 MASH architecture 177 is shown; that is to say, a second-order analog sigma-delta modulator 111 is used, a first-order digital sigma-delta modulator 121, a first-order digital sigma-delta modulator 122, and a first-order digital sigma-delta modulator 123. The digital sigma-delta modulators 121, 122, 123 are arranged in a MASH architecture 177 with respect to one another. This means that the sigma-delta modulator 121 outputs a digital error signal 167-1 to the sigma-delta modulator 122 which is indicative of a noise contribution of the sigma-delta modulator 121. The sigma-delta modulator 122, in turn, outputs a digital error signal 167-2 to the sigma-delta modulator 123 which is indicative of a noise contribution of the sigma-delta modulator 122. The sigma-delta modulators 121, 122, 123 in each case include their own feedback path 509 (not shown in FIG. 10). From FIG. 10, it can be seen that the sigma-delta modulator 111 includes two amplification structures 202-1, 202-2; the sigma-delta modulators 121, 122, 123 have in each case a single amplification structure 502-1, 502-2, 502-3.

From a comparison of FIGS. 7-10, it can be seen that the analog stage 110 and the digital stage 120 can be flexibly equipped. Although in FIGS. 7-10, e.g., only a single second-order analog sigma-delta modulator 111 is shown, a greater number of analog sigma-delta modulators could be used in other examples, e.g. in a MASH architecture 177. I.e., it is possible that the analog stage 110 forms a MASH architecture 177. It would also be possible to use analog sigma-delta modulators of the first or third order, etc.

Furthermore, a flexible number of K digital sigma-delta modulators 121, 122, 123 can be used in the digital stage 120, e.g. in the MASH architecture 177. E.g., K can be =two, three or four.

Furthermore, digital sigma-delta modulators 121, 122, 123 can be used for the digital stage 120 which are of first or second or higher order. In this context, different digital sigma-delta modulators can have a different order.

By using a greater number of digital sigma-delta modulators for the digital stage 120, compensating for the noise component of the at least one analog sigma-delta modulator of the analog stage 110 can be typically particularly accurate. Typically, the noise transfer function of the ADC 100 can then have an order of L+K. In this context, L—as described above—designates the order of the analog sigma-delta modulator 111 and K designates—as described above—the number or order, respectively, of the digital sigma-delta modulators 121, 122, 123. As an example, it is possible to refer to the 2-1 MASH architecture 177 shown in FIG. 7. The noise transfer function of the ADC 100 has here the order of 2+1=3. Experimentally and in exemplary manner, it was possible to verify an approx. quadruple signal-to-noise improvement in contrast to a comparable second order analog sigma-delta modulator. By this means, an increase in resolution by 12 dB can be achieved. The additional digital signal processing in the form of the digital stage 120 is comparatively less complex. Furthermore, the more efficient ADC which implements the comparison circuit 203 (see FIG. 5) needs a lower area and can be implemented with low power consumption. E.g., a 4-bit successive approximation (SAR) ADC can be used as comparison circuit 203. An improved performance can be achieved with the 2-2 MASH architecture 177 of FIG. 8. Adding even further digital sigma-delta modulators can enhance the performance even further without the hardware requirements or power consumption increasing excessively.

In FIGS. 7-10, no digital correction circuit 125 for adapting the output signals of the analog stage no and of the digital stage 120 with respect to one another is drawn for reasons of clarity. In these implementations, too, however, the digital correction circuit 125 can be provided. The digital correction circuit can be provided, e.g., in path 164, 164-1, 164-2, 164-3.

Figure 11:
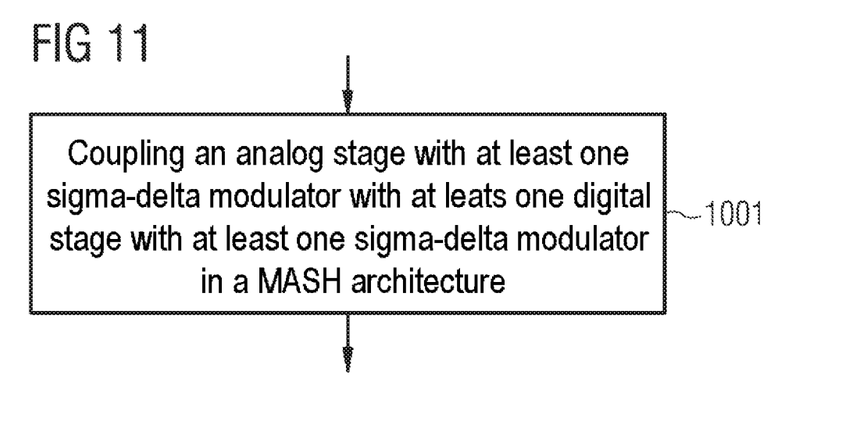
FIG. 11 is a flow chart of a method according to various embodiments.

FIG. 11 is a flow chart of an exemplary method. In 1001, an analog stage is coupled with a digital stage. The analog stage includes at least one analog sigma-delta modulator. The digital stage also includes at least one digital sigma-delta modulator.

The analog sigma-delta modulators can have various orders. In various examples, the analog sigma-delta modulators have first order or second order. In this manner, a particularly stable operation can be ensured.

If a number of analog sigma-delta modulators are used, these can be arranged, e.g., in a MASH architecture.

The digital sigma-delta modulators can also have various orders. Alternatively or additionally, it is also possible that a number of digital sigma-delta modulators are arranged in a MASH architecture.

Coupling is effected, e.g., via a digital error signal which is indicative of a noise contribution of the at least one analog sigma-delta modulator of the analog stage.

In summary, techniques for A/D conversion have been described above. These techniques provide for a hardware-efficient A/D conversion with comparatively low power consumption. It is possible to ensure high stability of the A/D conversion on the basis of sigma-delta modulators. In addition, the A/D conversion can provide a result signal which maps the analog input signal with high linearity. The A/D conversion can have a particularly large SNR.

These effects can be achieved by using a hybrid analog/digital MASH architecture for noise shaping. By using a downstream digital stage with one or more sigma-delta modulators with digital amplification structure, it is possible to use an analog stage with comparatively relaxed requirements for the noise contribution of the corresponding at least one sigma-delta modulator. The noise contribution of the at least one sigma-delta modulator of the analog stage is at least partially compensated for by the downstream digital stage.

The techniques for A/D conversion described in the present text can be applied in different regions. For example, applications from audio signal processing fall back on an ADC described in the present text. Other examples relate to sensitive measuring technique, imaging, communication technique, etc.

Naturally, the features of the embodiments and aspects of the invention described earlier can be combined with one another. In particular, the features can be used not only in the combinations described but also in other combinations or by themselves, without departing from the field of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An analog/digital converter comprising:
   an analog stage comprising at least one first sigma-delta modulator; and
   a digital stage comprising at least one second sigma-delta modulator,
   wherein the at least one first sigma-delta modulator is configured to convert an analog input signal into a first digital output signal,
   wherein the analog stage is configured to output a digital signal to the digital stage, wherein the digital signal is indicative of a noise contribution of the at least one first sigma-delta modulator, wherein the at least one second sigma-delta modulator is configured to convert the digital signal into a second digital output signal, wherein the analog/digital converter is configured to determine a digital result signal which is indicative of the analog input signal on the basis of the first digital output signal and the second digital output signal, and wherein the analog stage and the digital stage are arranged in a multi-stage noise shaping architecture.

2. An analog/digital converter comprising:

an analog stage comprising at least one first sigma-delta modulator; and a digital stage comprising at least one second sigma-delta modulator, wherein the analog stage is configured to output a digital signal to the digital stage, wherein the digital signal is indicative of a noise contribution of the at least one first sigma-delta-modulator, and wherein the analog stage and the digital stage are arranged in a multi-stage noise shaping architecture.

3. The analog/digital converter as claimed in claim 2, wherein each of the at least one first sigma-delta modulators the analog stage is of the L-th order, and wherein L is at least equal to one or two.

4. The analog/digital converter as claimed in claim 3, wherein the digital stage comprises a number of K second sigma-delta modulators in a multi-stage noise shaping architecture, and wherein K is at least equal to one or two.

5. The analog/digital converter as claimed in claim 4, wherein the analog/digital converter (100) has a noise transfer function of the order L+K.

6. The analog/digital converter (100) as claimed in claim 2, wherein the at least one first sigma-delta modulator comprises at least one 1-bit feedback path.

7. The analog/digital converter as claimed in claim 2, wherein the analog stage comprises an n-bit comparison circuit, wherein n is greater than or equal to two, and wherein the digital signal has an n-bit word length.

8. The analog/digital converter as claimed in claim 7, wherein the comparison circuit comprises an analog/digital converter.

9. The analog/digital converter as claimed in claim 7, wherein n is greater than three.

10. The analog/digital converter as claimed claim 7, wherein the at least one second sigma-delta modulator comprises at least one n-bit feedback path.

11. The analog/digital converter as claimed in claim 2, wherein each of the at least one first sigma-delta modulators comprises at least one analog amplification structure and one comparison circuit, wherein each of the at least one second sigma-delta modulators comprises at least one digital amplification structure.

12. The analog/digital converter as claimed in claim 2, wherein the digital stage is configured to at least partially compensate for a noise contribution of the at least one first sigma-delta modulator.

13. The analog/digital converter as claimed in claim 2, further comprising a digital correction circuit configured to adapt a second digital output signal of the at least one second sigma-delta modulator to a first digital output signal of the at least one first sigma-delta modulator.

14. A method comprising:

using a digital signal, coupling an analog stage with at least one first sigma-delta modulator and one digital stage with at least one second sigma-delta modulator, wherein the analog stage and the digital stage are arranged in a multi-stage noise shaping architecture.

15. The method as claimed in claim 14, further comprising:

using the at least one first sigma-delta modulator, converting an analog input signal into a first digital output signal;

outputting a digital signal to the digital stage, wherein the digital signal is indicative of a noise contribution of the at least one first sigma-delta modulator;

converting the digital signal into a second digital output signal; and determining a digital result signal based on the first digital output signal and the second digital output signal, wherein the digital result signal is indicative of the analog input signal.

* * * * *